(12) United States Patent
Kim et al.

(10) Patent No.: US 12,001,238 B2
(45) Date of Patent: Jun. 4, 2024

(54) DISPLAY DEVICE AND MANUFACTURING METHOD THEREOF

(71) Applicant: Samsung Display Co., LTD., Yongin-si (KR)

(72) Inventors: Tae Hyun Kim, Seoul (KR); Jonghyun Choi, Seoul (KR); Jiryun Park, Cheonan-si (KR); Seokje Seong, Seongnam-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 343 days.

(21) Appl. No.: 17/144,657

(22) Filed: Jan. 8, 2021

(65) Prior Publication Data

US 2021/0397216 A1 Dec. 23, 2021

(30) Foreign Application Priority Data

Jun. 19, 2020 (KR) .................. 10-2020-0075254

(51) Int. Cl.
| | |
|---|---|
| G06F 1/16 | (2006.01) |
| B32B 7/023 | (2019.01) |
| G02B 1/11 | (2015.01) |
| G02B 1/14 | (2015.01) |
| G09F 9/30 | (2006.01) |
| H10K 71/00 | (2023.01) |

(52) U.S. Cl.
CPC ............ *G06F 1/1607* (2013.01); *B32B 7/023* (2019.01); *G02B 1/11* (2013.01); *G02B 1/14* (2015.01); *G09F 9/301* (2013.01); *B32B 2307/42* (2013.01); *B32B 2457/206* (2013.01); *H10K 71/00* (2023.02)

(58) Field of Classification Search
None
See application file for complete search history.

(56) References Cited

U.S. PATENT DOCUMENTS

| | | | |
|---|---|---|---|
| 9,516,771 B2 | 12/2016 | Byeon | |
| 9,706,607 B2 | 7/2017 | Kim et al. | |
| 9,718,263 B2 | 8/2017 | Namkung et al. | |
| 10,319,939 B2 | 6/2019 | Seong et al. | |
| 2013/0088460 A1* | 4/2013 | Ahn | ........ G06F 3/0412 345/175 |
| 2014/0353598 A1* | 12/2014 | Jeong | ........ H01L 23/544 257/40 |
| 2017/0194397 A1* | 7/2017 | Kim | ........ H10K 50/8426 |
| 2018/0149785 A1* | 5/2018 | Lee | ........ G02F 1/133305 |
| 2018/0151845 A1* | 5/2018 | Jeong | ........ H10K 59/40 |
| 2018/0315951 A1* | 11/2018 | Seong | ........ H10K 59/87 |

FOREIGN PATENT DOCUMENTS

| | | |
|---|---|---|
| KR | 10-2015-0145152 | 12/2015 |
| KR | 10-2016-0044162 | 4/2016 |
| KR | 10-1869669 | 6/2018 |

* cited by examiner

*Primary Examiner* — Anthony J Frost
(74) *Attorney, Agent, or Firm* — KILE PARK REED & HOUTTEMAN PLLC

(57) ABSTRACT

A display device may include a display panel, and an anti-reflection layer disposed on the display panel. The display panel may include a first area including a first alignment mark, a bending area extending from the first area, and a second area extending from the bending area. The anti-reflection layer may include a second alignment mark overlapping the second area in a plan view.

17 Claims, 15 Drawing Sheets

DISPLAY DEVICE AND MANUFACTURING METHOD THEREOF

CROSS-REFERENCE TO RELATED APPLICATION(S)

This application claims priority to and benefits of Korean Patent Application No. 10-2020-0075254 under 35 U.S.C. § 119, filed in the Korean Intellectual Property Office on Jun. 19, 2020, the entire contents of which are incorporated herein by reference.

BACKGROUND

1. Technical Field

The disclosure herein relates to a display device and a method for manufacturing same.

2. Description of the Related Art

Generally, electronic apparatuses that provide a user with an image, such as smart phones, digital cameras, laptop computers, navigation units, and smart televisions, include a display device for displaying the image. The display device may generate an image, and the generated image may be provided to the user through a display screen.

Due to technological development of display devices in recent years, a display device including a flexible display panel has been developed. The display panel may include pixels for displaying an image and a driving chip for driving the pixels. The pixels may be disposed in a display area of the display panel, and the driving chip may be disposed in a non-display area of the display panel surrounding the display area. A bending portion may be defined between the driving chip and the display area, and the bending portion may be bent so that the driving chip may be disposed below the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device, in which a bending area of a display panel may be bent with predetermine curvature, and a method for manufacturing same.

An embodiment of the inventive concept provides a display device that may include a display panel, and an anti-reflection layer disposed on the display panel. The display panel may include a first area including a first alignment mark, a bending area extending from the first area, and a second area extending from the bending area. The anti-reflection layer may include a second alignment mark overlapping the second area in a plan view.

The second alignment mark may be defined on a surface of the anti-reflection layer.

The anti-reflection layer may include a polarization film, and a hard coating layer disposed on the polarization film, wherein the second alignment mark may be defined on the hard coating layer.

The first alignment mark and the second alignment mark may be adjacent to the bending area.

The first alignment mark may have a shape different from a shape of the second alignment mark.

The first area may include a display area including a pixel, and a non-display area adjacent to the display area, wherein the first alignment mark may be defined in the non-display area.

The pixel may include a transistor, and a light emitting element electrically connected to the transistor, wherein the first alignment mark and a conductive pattern of the transistor may be disposed on a same layer.

The first alignment mark and the conductive pattern may include a same material and may be simultaneously formed by patterning.

The display device may further include a driver spaced apart from the anti-reflection layer and disposed in the second area, and a cover tape disposed in the second area to cover the driver. The cover tape may be disposed on the anti-reflection layer disposed in the second area, and the cover tape may not overlap the second alignment mark.

The first area, the bending area, and the second area may be arranged in a first direction, and the bending area may extend in a second direction crossing the first direction.

The first alignment mark is provided in plurality, and the plurality of first alignment marks are disposed adjacent to sides of the first area which are opposite to each other in the second direction.

The second alignment mark may be provided in plurality, and the plurality of second alignment marks may be disposed adjacent to sides of the second area which may be opposite to each other in the second direction.

The second area may be disposed below the first area in case that the bending area is bent, and the second alignment mark may be adjacent to the first alignment mark in case that the bending area is bent.

The first alignment mark and the second alignment mark may be aligned with a horizontal line parallel to the second direction in case that the bending area is bent, and the second alignment mark may be spaced from the first alignment mark in the second direction in case that the bending area is bent.

The display device may include a panel protective film disposed below the display panel and in which an opening portion overlapping the bending area may be defined, an input sensing part disposed in the first area, and a window disposed on the input sensing part. The anti-reflection layer may be disposed in the first area and between the input sensing part and the window, the anti-reflection layer extending into the bending area and the second area.

The first alignment mark and the second alignment mark may have a same shape.

In an embodiment of the inventive concept, a method for manufacturing a display device may include preparing a display panel which including a first area including a first alignment mark, a bending area extending from the first area, and a second area extending from the bending area. The method may include providing an anti-reflection layer on the display panel, providing, in the second area, a driver spaced apart from the anti-reflection layer, emitting laser onto a portion of the anti-reflection layer, which overlaps the second area, to form a second alignment mark, and providing a cover tape in the second area to cover the driver. The cover tape may be disposed on the anti-reflection layer disposed in the second area, and the cover tape may not overlap the second alignment mark.

The anti-reflection layer may include a polarization film, and a hard coating layer disposed on the polarization film. The second alignment mark may be defined on the hard coating layer.

The first area, the bending area, and the second area may be arranged in a first direction, the bending area may extend in a second direction crossing the first direction, and the first alignment mark and the second alignment mark may be adjacent to the bending area.

The method may further include bending the bending area to dispose the second area below the first area; and aligning the second alignment mark with the first alignment mark. The first alignment mark and the second alignment mark may be aligned with a horizontal line parallel to the second direction, and the second alignment mark may be spaced from the first alignment mark in the second direction.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION OF THE EMBODIMENTS

Figure 1:
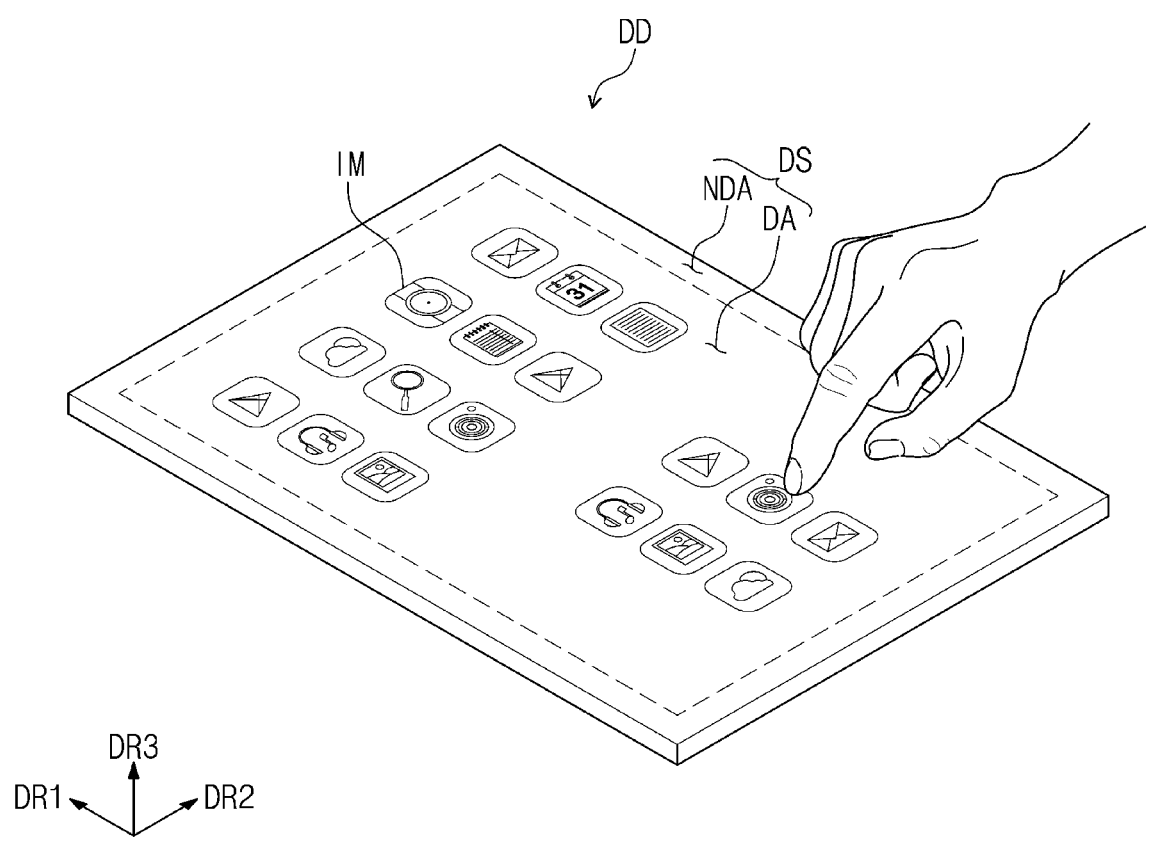
FIG. 1 is a schematic perspective view of a display device according to an embodiment of the inventive concept.

Hereinafter, embodiments of the inventive concept will be described in detail with reference to the accompanying drawings.

It will be understood that when an element (or a region, a layer, a portion, or the like) is referred to as "being on", "connected to" or "coupled to" another element in the specification, it can be directly disposed on, connected or coupled to another element, or intervening elements may be disposed therebetween.

Like numbers refer to like elements throughout. Also, in the drawings, the thicknesses, ratios, and dimensions of the elements may be exaggerated for effective description of the technical contents.

The term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or.

It will be understood that, although the terms "first", "second", etc. may be used herein to describe various elements, these elements should not be limited by these terms. These terms are only used to distinguish one element from another element. For example, a first element may be referred to as a second element, and similarly, a second element may be referred to as a first element without departing from the scope of the disclosure. The singular forms are intended to include the plural forms as well unless the context clearly indicates otherwise.

Also, terms such as "below", "lower", "above", and "upper" may be used to describe the relationships of the components illustrated in the drawings. These terms have a relative concept, and are described on the basis of the directions indicated in the drawings.

The term "overlap" may include layer, stack, face or facing, extending over, extending under, covering or partly covering or any other suitable term as would be appreciated and understood by those of ordinary skill in the art. The expression "not overlap" may include 'apart from' or 'set aside from' or 'offset from' and any other suitable equivalents as would be appreciated and understood by those of ordinary skill in the art.

Unless otherwise defined, all terms (including technical and scientific terms) used herein have the same meaning as commonly understood by one of ordinary skill in the art to which the disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that the terms such as "has", "includes" or "comprises", when used in this application, specify the presence of stated features, integers, steps, operations, elements, components, or a combination thereof, but do not preclude the presence or addition of one or more other features, integers, steps, operations, elements, components, or combinations thereof.

FIG. 1 is a schematic perspective view of a display device according to an embodiment of the inventive concept.

Referring to FIG. 1, a display device DD according to an embodiment of the inventive concept may have a rectangular shape having long sides in a first direction DR1 and having short sides in a second direction DR2 crossing the first direction DR1. However, embodiments of the inventive concept are not limited thereto, and the display device DD may have various shapes such as a circle or a polygon.

Hereinafter, a third direction DR3 may be defined as a direction that substantially perpendicularly crosses the plane defined by the first direction DR1 and the second direction DR2. The expression of "in case viewed in a plane" may mean a state in case viewed in the third direction DR3.

The top surface of the display device DD may be defined as a display surface DS, and may have a plane defined by the first direction DR1 and the second direction DR2. Through the display surface DS, an image IM generated in the display device DD may be provided to a user.

The display surface DS may include a display area DA and a non-display area NDA around the display area DA. The display area DA may display an image, and the non-display area NDA may not display an image. The non-display area NDA may define an edge of the display device DD, which surrounds the display area DA and may be printed with a color.

The display device DD of an embodiment may be used in a large scale electronic apparatus such as a television, a monitor, or an outdoor advertisement board. Also, the display device DD may be used in a small-to-medium electronic apparatus such as a personal computer, a laptop computer, a personal digital terminal, a vehicle navigation unit, a game console, a smart phone, a tablet, or a camera. However, these are merely provided as embodiments, and the display device DD may be used in other electronic apparatuses as long as not departing from the inventive concept.

Figure 2:
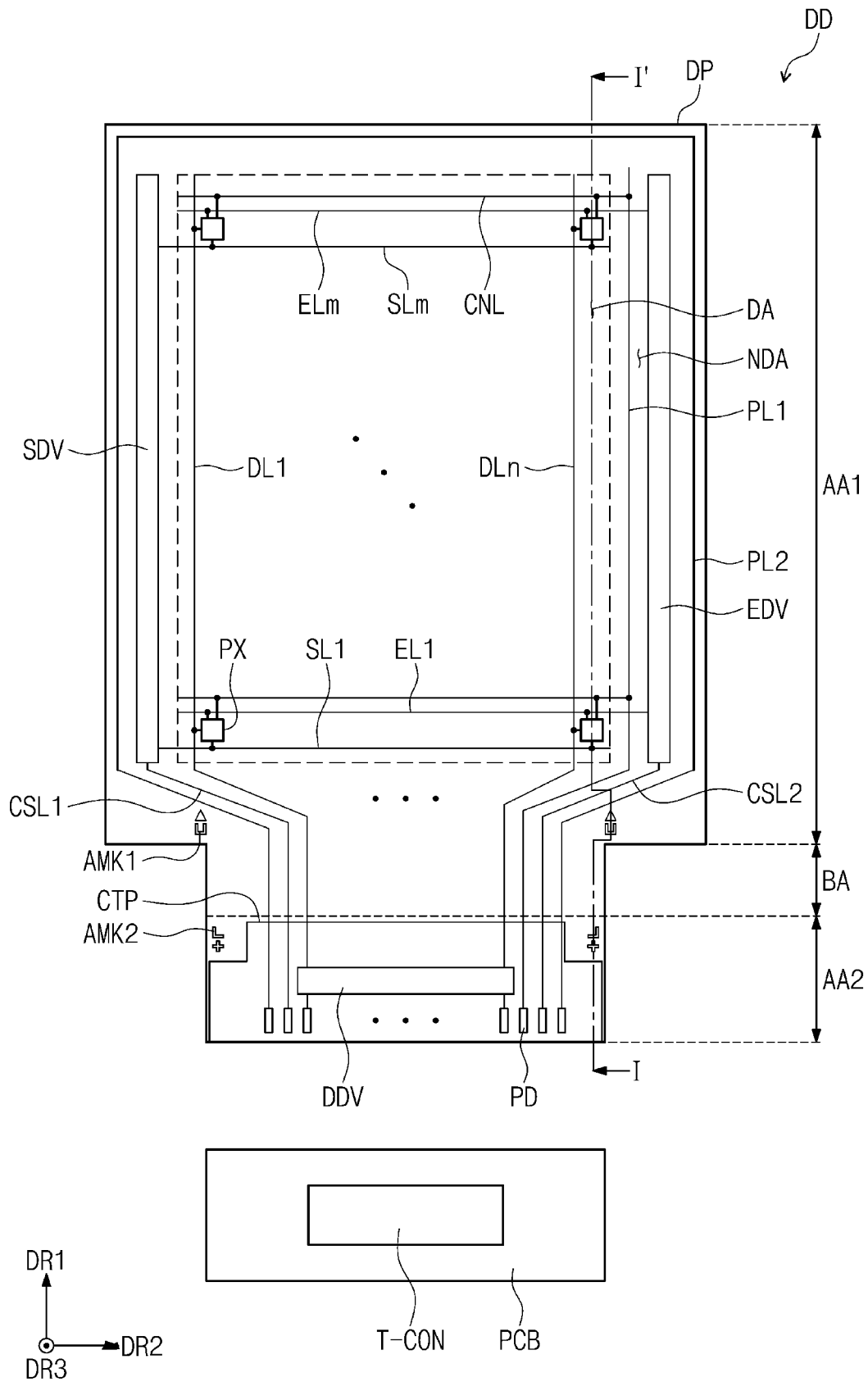
FIG. 2 is a schematic plan view of the display device illustrated in FIG. 1.

FIG. 2 is a schematic plan view of the display device illustrated in FIG. 1.

Referring to FIG. 2, the display device DD may include a display panel DP; a scan driver SDV; a data driver DDV; an emission driver EDV; a cover tape CTP; a printed circuit board PCB; and a timing controller T-CON.

The display panel DP according to an embodiment of the inventive concept may be a light emitting-type display panel, but is not particularly limited thereto. For example, the display panel DP may be an organic light emitting display panel or a quantum-dot light emitting display panel. A light emitting layer of the organic light emitting display panel may include an organic light emitting material. A light emitting layer of the quantum-dot light emitting display panel may include quantum dots, quantum rods, or the like. Hereinafter, the display panel DP is described as an organic light emitting display panel.

The display panel DP may be a flexible display panel. For example, the display panel DP may include electronic elements disposed on a flexible substrate. The display panel DP may extend longer in the first direction DR1 than in the second direction DR2. The display panel DP may have a plane defined by first and second directions DR1 and DR2.

The display panel DP may include a first area AA1, a second area AA2, and a bending area BA disposed between the first area AA1 and the second area AA2. The first area AA1, the bending area BA, and the second area AA2 may be arranged in the first direction DR1, and the bending area BA may extend in the second direction DR2. The bending area BA may extend from the first area AA1 in the first direction DR1, and the second area AA2 may extend from the bending area BA in the first direction DR1.

The first area AA1 may have long sides which extend in the first direction DR1 and may be opposite to each other in the second direction DR2. With respect to the second direction DR2, each of lengths of the bending area BA and the second area AA2 may be less than a length of the first area AA1.

The first area AA1 may include a display area DA and a non-display area NDA around the display area DA. The non-display area NDA may surround the display area DA. The display area DA may display an image, and the non-display area NDA may not display an image. The second area AA2 and the bending area BA may not display an image.

The display panel DP may include pixels PX; scan lines SL1 to SLm; data lines DL1 to DLn; emission lines EL1 to ELm; first and second control lines CSL1 and CSL2; a first power line PL1; a second power line PL2; connection lines CNL; and pads PD. Here, m and n may be natural numbers. The pixels PX may be disposed in the display area DA, and may be electrically connected to the scan lines SL1 to SLm, the data lines DL1 to DLn, and the emission lines EL1 to ELm.

The scan driver SDV and the emission driver EDV may be disposed in the non-display area NDA. The scan driver SDV and the emission driver EDV may be disposed adjacent to respective long sides of the first area AA1. The data driver DDV may be disposed in the second area AA2.

The data driver DDV may be manufactured in the form of an integrated circuit chip and mounted in the second area AA2. The data driver DDV may be defined as a driving IC. The cover tape CTP may be disposed in the second area AA2 to cover the data driver DDV.

The scan lines SL1 to SLm may extend in the second direction DR2 and be electrically connected to the scan driver SDV. The data lines DL1 to DLn may extend in the first direction DR1 and be electrically connected to the data driver DDV via the bending area BA. The emission lines EL1 to ELm may extend in the second direction DR2 and be electrically connected to the emission driver EDV.

The first power line PL1 may extend in the first direction DR1 and be disposed on the non-display area NDA. The first power line PL1 may be disposed between the display area DA and the emission driver EDV. However, embodiments of the inventive concept are not limited thereto, and the first power line PL1 may be disposed between the display area DA and the scan driver SDV.

The first power line PL1 may extend to the second area AA2 via the bending area BA. The first power line PL1 may extend toward a lower end of the second area AA2 in case viewed in a plan view. The first power line PL1 may receive a first voltage.

The second power line PL2 may be disposed both in the non-display area NDA facing the second area AA2 with the display area DA therebetween and in the non-display area NDA adjacent to the long sides of the first area AA1. The second power line PL2 may be disposed outside the scan driver SDV and the emission driver EDV.

The second power line PL2 may extend to the second area AA2 via the bending area BA. In the second area AA2, the second power line PL2 may extend in the first direction DR1 with the data driver DDV therebetween. The second power line PL2 may extend toward the lower end of the second area AA2 in case viewed in a plan view.

The second power line PL2 may receive a second voltage having a lower level than the first voltage. Although the connection relationship is not illustrated for the convenience of illustration, the second power line PL2 may extend onto the display area DA and be electrically connected to the pixels PX, and the second voltage may be supplied to the pixels PX through the second power line PL2.

The connection lines CNL may extend in the second direction DR2 and be arranged in the first direction DR1. The connection lines CNL may be electrically connected to the first power line PL1 and the pixels PX. The first voltage may be applied to the pixels PX through the first power line PL1 and the connection lines CNL which may be electrically connected to each other.

The first control line CSL1 may be electrically connected to the scan driver SDV and extend toward the lower end of the second area AA2 via the bending area BA. The second control line CSL2 may be electrically connected to the emission driver EDV and extend toward the lower end of the second area AA2 via the bending area BA. The data driver DDV may be disposed between the first control line CSL1 and the second control line CSL2.

In case viewed in a plane, the pads PD may be disposed adjacent to the lower end of the second area AA2. The data driver DDV, the first power line PL1, the second power line PL2, the first control line CSL1, and the second control line CSL2 may be electrically connected to the pads PD.

The data lines DL1 to DLn may be electrically connected to the respective pads PD through the data driver DDV. For example, the data lines DL1 to DLn may be electrically connected to the data driver DDV, and the data driver DDV may be electrically connected to the pads PD which correspond to the data lines DL1 to DLn, respectively.

In the display panel DP, first alignment marks AMK1 may be defined. The first alignment marks AMK1 may be defined in the non-display area NDA. In the second area AA2 of the display panel DP, second alignment marks AMK2 may be defined. Specific configurations of the first and second alignment marks AMK1 and AMK2 will be described in more detail with reference to FIGS. 4 to 7.

The printed circuit board PCB may be electrically connected to the pads PD. The timing controller T-CON may be disposed on the printed circuit board PCB. The timing controller T-CON may be made of an integrated circuit chip and mounted to the printed circuit board PCB. The timing controller T-CON may be electrically connected to the pads PD through the printed circuit board PCB.

Although not illustrated, the display device DD may further include a voltage generator for generating the first voltage and the second voltage. The voltage generator may be electrically connected to the pads PD which may be electrically connected to the first and second power lines PL1 and PL2.

The timing controller T-CON may control operations of the scan driver SDV, the data driver DDV, and the emission driver EDV. The timing controller T-CON may generate a scan control signal, a data control signal, and an emission control signal in response to control signals received from the outside.

The scan control signal may be provided to the scan driver SDV through the first control line CSL1. The emission control signal may be provided to the emission driver EDV through the second control line CSL2. The data control signal may be provided to the data driver DDV. The timing controller T-CON may receive image signals from the outside, convert the data format of image signals to meet interface specifications with the data driver DDV, and provide the converted image signals to the data driver DDV.

The scan driver SDV may generate scan signals in response to the scan control signal. The scan signals may be applied to the pixels PX through the scan lines SL1 to SLm. The scan signals may be sequentially applied to the pixels PX.

The data driver DDV may generate data voltages, which correspond to the image signals, in response to the data control signal. The data voltages may be applied to the pixels PX through the data lines DL1 to DLn. The emission driver EDV may generate emission signals in response to the emission control signal. The emission signals may be applied to the pixels PX through the emission lines EL1 to ELm.

The pixels PX may receive the data voltages in response to the scan signals. The pixels PX may emit light, having luminance corresponding to the data voltages, in response to the emission signals, thereby displaying an image. Light emission times of the pixels PX may be controlled by the emission signals.

Figure 3:
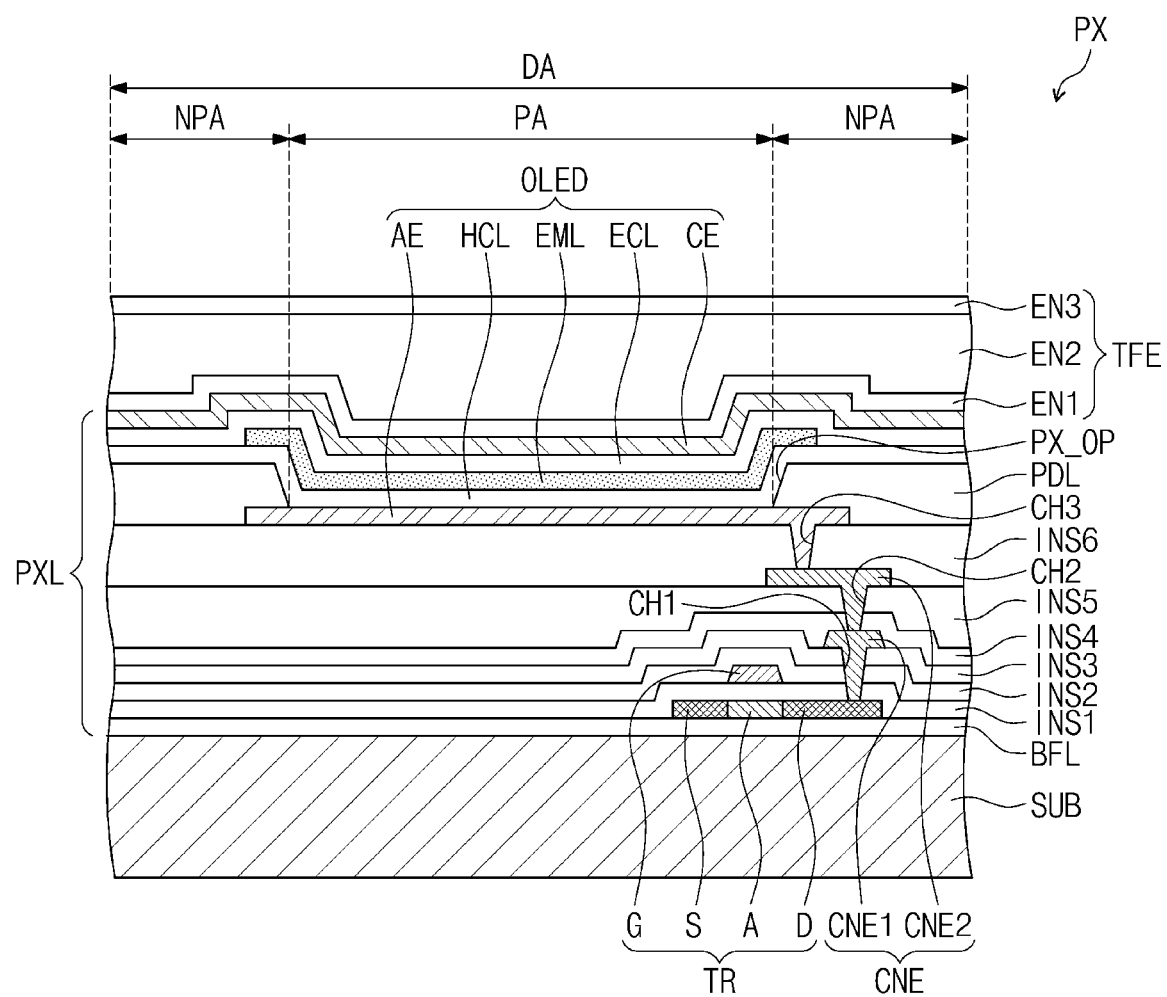
FIG. 3 is a schematic view illustratively showing a cross-section of one of the pixels illustrated in FIG. 2.

FIG. 3 is a schematic view illustratively showing a cross-section of one of the pixels illustrated in FIG. 2.

Referring to FIG. 3, the pixel PX may be disposed on a substrate SUB and include a transistor TR and a light emitting element OLED. The light emitting element OLED may include a first electrode AE, a sensing electrode CE, a hole control layer HCL, an electron control layer ECL, and a light emitting layer EML. The first electrode AE may be an anode electrode, and the second electrode CE may be a cathode electrode.

The transistor TR and the light emitting element OLED may be disposed on the substrate SUB. One transistor TR is illustratively shown in the drawing, but actually, the pixel PX may include multiple transistors and at least one capacitor to drive the light emitting element OLED.

The display area DA may include a light emitting area PA corresponding to the pixel PX and a non-light emitting area NPA around the light emitting area PA. The light emitting element OLED may be disposed in the light emitting area PA.

The substrate SUB may include a flexible plastic substrate. For example, the substrate SUB may include transparent polyimide (PI). A buffer layer BFL may be disposed on the substrate SUB, and the buffer layer BFL may be an inorganic layer. A semiconductor pattern may be disposed on the buffer layer BFL. The semiconductor pattern may include polysilicon. However, embodiments of the inventive concept are not limited thereto, and the semiconductor pattern may include amorphous silicon, a metal oxide, or a combination thereof.

The semiconductor pattern may have different electrical characteristics depending on whether the semiconductor pattern is doped or not. The semiconductor pattern may include a doped area and a non-doped area. The doped area may be doped with an N-type dopant or a P-type dopant. The doped area may have conductivity higher than that of the non-doped area, and substantially, serve as a source electrode and a drain electrode of the transistor TR. The non-doped area may substantially correspond to an active (or channel) of the transistor TR.

A source S, an active A, and a drain D of the transistor TR may be provided from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may be disposed between the transistor TR and the light emitting element OLED and connect the transistor TR to the light emitting element OLED. The connection electrode CNE may include a first connection electrode CNE1 and a second connection electrode CNE2.

The first connection electrode CNE1 may be disposed on the third insulating layer INS3 and electrically connected to the drain D through a first contact hole CH1 defined in the first to third insulating layers INS1 to INS3. A fourth insulating layer INS4 may be disposed on the first connection electrode CNE1. A fifth insulating layer INS5 may be disposed on the fourth insulating layer INS4.

The second connection electrode CNE2 may be disposed on the fifth conductive layer INS5. The second electrode CNE2 may be electrically connected to the first connection electrode CNE1 through a second contact hole CH2 defined in the fifth insulating layer INS5. A sixth insulating layer INS6 may be disposed on the second connection electrode CNE2. Each of the first insulating layer INS1 to the sixth insulating layer INS6 may be an inorganic layer or an organic layer.

The first electrode AE may be disposed on the sixth insulating layer INS6. The first electrode AE may be electrically connected to the second connection electrode CNE2 through a third contact hole CH3 defined in the sixth insulating layer INS6. A pixel defining layer PDL that exposes a portion of the first electrode AE may be disposed on the first electrode AE and the sixth insulating layer INS6. An opening portion PX_OP for exposing the portion of the first electrode AE may be defined in the pixel defining PDL.

The hole control layer HCL may be disposed on the first electrode AE and the pixel defining layer PDL. The hole control layer HCL may be disposed in common in the light emitting area PA and the non-light emitting area NPA. The hole control layer HCL may include a hole transport layer and a hole injection layer.

The light emitting layer EML may be disposed on the hole control layer HCL. The light emitting layer EML may be disposed in an area corresponding to the opening portion PX_OP. The light emitting layer EML may include an organic material and/or an inorganic material. The light emitting layer EML may generate one or more light of red, green, or blue light.

The electron control layer ECL may be disposed on the light emitting layer EML and the hole control layer HCL. The electron control layer ECL may be disposed in common in the light emitting area PA and the non-light emitting area NPA. The electron control layer ECL may include an electron transport layer and an electron injection layer.

The second electrode CE may be disposed on the electron control layer ECL. The second electrode CE may be disposed in common in the pixels PX. A pixel layer PXL may be defined as the layers from the buffer layer BFL to the light emitting element OLED.

A thin film encapsulation layer TFE may be disposed on the light emitting element layer OLED. The thin film encapsulation layer TFE may be disposed on the second electrode CE to cover the pixels PX. The thin film encapsulation layer TFE may include a first encapsulation layer EN1 disposed on the second electrode CE and a second encapsulation layer EN2 disposed on the first encapsulation layer EN1, and a third encapsulation layer EN3 disposed on the second encapsulation layer EN2.

The first and third encapsulation layers EN1 and EN3 may be an inorganic layer, and the second encapsulation layer EN2 may be an organic layer. The first and third encapsulation layers EN1 and EN3 may protect the pixel PX against moisture/oxygen. The second encapsulation layer EN2 may protect the pixel PX against impurities such as dust particles.

The first voltage may be applied to the first electrode AE through the transistor TR, and the second voltage having a level lower than that of the first voltage may be applied to the second electrode CE. A hole and an electron injected into the light emitting layer EML may be coupled to each other to form an exciton, and while the exciton may be transited to a ground state, the light emitting element OLED may emit light.

Figure 4:
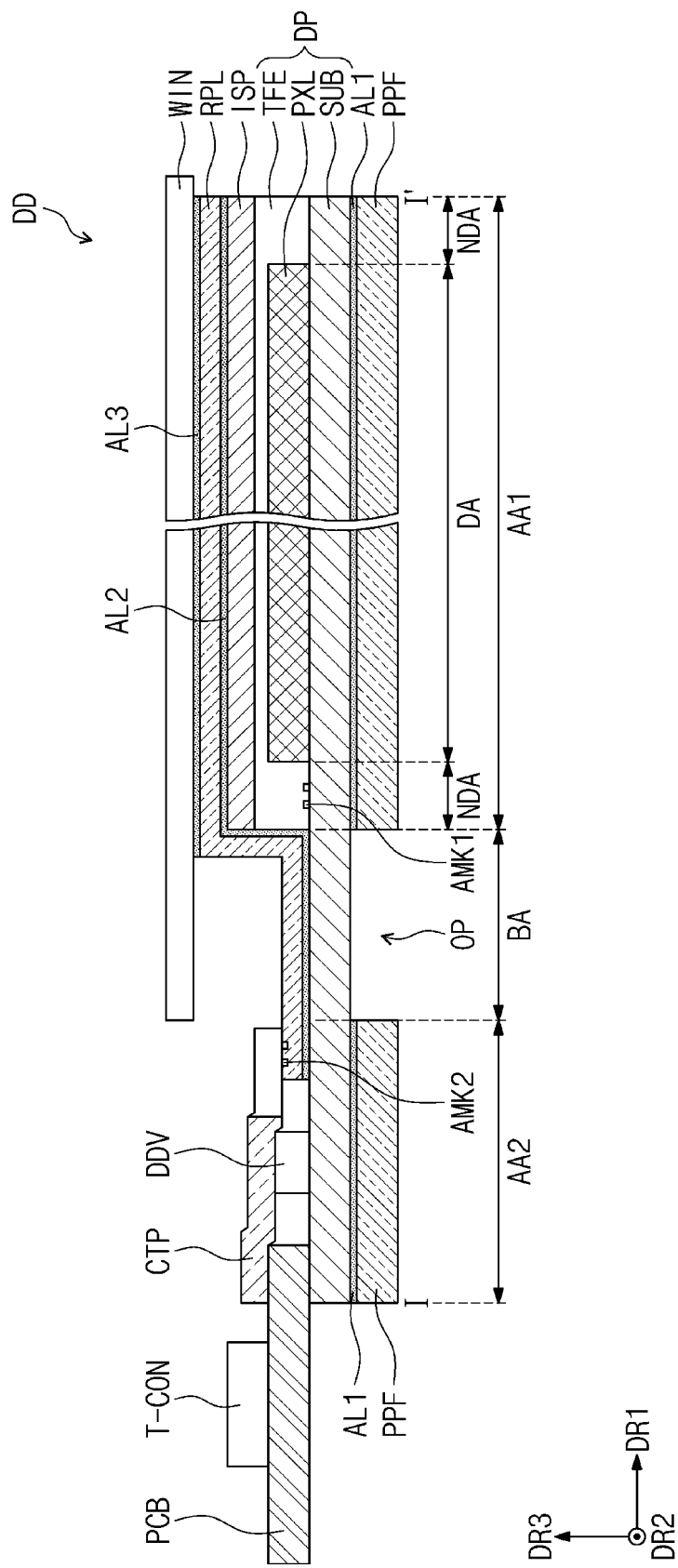
FIG. 4 is a schematic cross-sectional view taken along line I-I' of FIG. 2.
Figure 5:
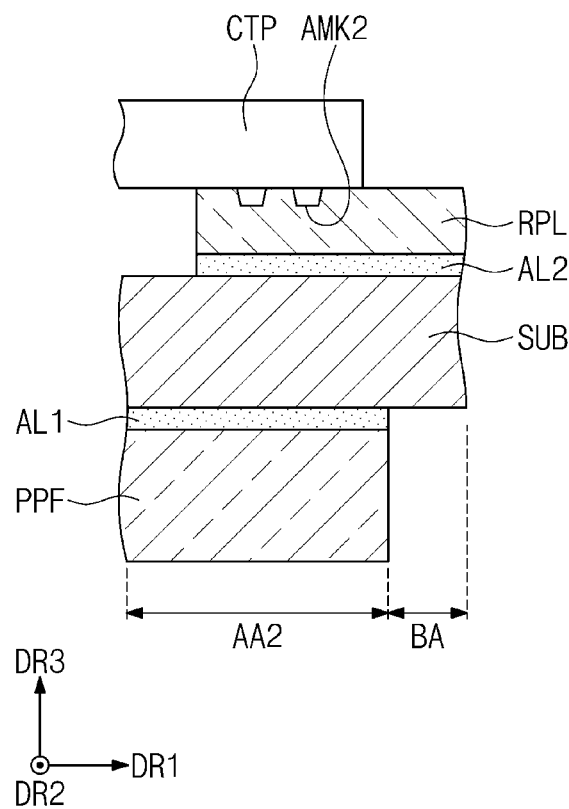
FIG. 5 is an enlarged schematic view of a second area adjacent to a bending area illustrated in FIG. 4.
Figure 6:
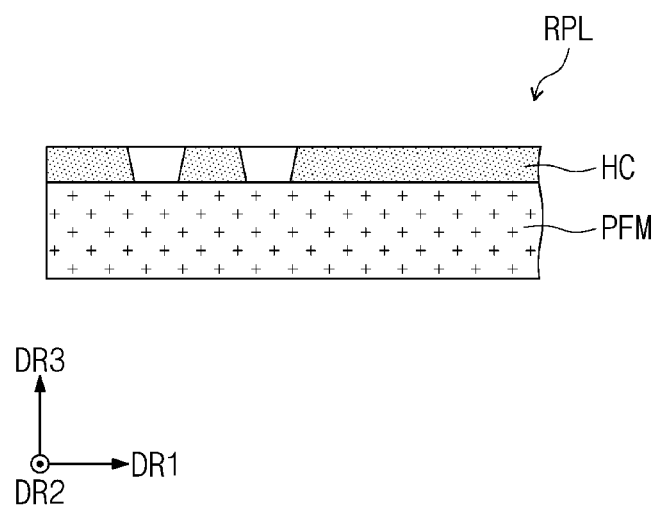
FIG. 6 is a schematic view illustrating a structure of an anti-reflection layer disposed on a second area illustrated in FIG. 5.

FIG. 4 is a schematic cross-sectional view taken along line I-I' of FIG. 2. FIG. 5 is an enlarged schematic view illustrating a plane of the second area adjacent to the bending area illustrated in FIG. 4. FIG. 6 is a schematic view illustrating a structure of the anti-reflection layer disposed in the second area illustrated in FIG. 5.

Referring to FIG. 4, the display device DD may include the display panel DP, a panel protective film PPF, an input sensing part ISP, an anti-reflection layer RPL, a window WIN, first, second, and third adhesive layers AL1, AL2, and AL3, the data driver DDV, the printed circuit board PCB, the timing controller T-CON, and the cover tape CTP.

The panel protective film PPF may be disposed below the display panel DP. The panel protective film PPF may include a flexible plastic material. For example, the panel protective film PPF may include polyethylene terephthalate (PET).

In the panel protective film PPF, an opening portion OP overlapping the bending area BA may be defined. For example, the panel protective film PPF may be disposed below the first area AA1 and the second area AA2 and may not be disposed below the bending area BA.

The first adhesive layer AL1 may be disposed between the display panel DP and the panel protective film PPF. The first adhesive layer AL1 may be disposed below the first area AA1 and the second area AA2 and may not be disposed below the bending area BA. The display panel DP and the panel protective film PPF may be bonded to each other through the first adhesive layer AL1.

The pixel layer PXL may be disposed on the substrate SUB. The pixel layer PXL may be disposed in the first area AA1 of the display panel DP. The pixel layer PXL may overlap the display area DA. The thin film encapsulation layer TFE may be disposed on the pixel layer PXL in the first area AA1.

The input sensing part ISP may be disposed on the display panel DP. The input sensing part ISP may be disposed on (e.g., directly on) the first area AA1 of the display panel DP. The input sensing part ISP may be disposed on (e.g., directly on) the thin film encapsulation layer TFE in conjunction with manufacture of the display device DD. However, embodiments of the inventive concept are not limited thereto. For example, the input sensing part ISP may be made of a panel separated from the display panel DP, and may be attached to the display panel DP by an adhesive layer.

The input sensing part ISP may sense an external input such as touch of a user, change the external input into an input signal, and provide the input signal to the display panel DP. The touch sensing part ISP may include sensor parts (not shown) for detecting the external input. The sensor parts may sense the external input in a capacitive method. The display panel DP may receive the input signal from the input sensing part ISP and generate an image corresponding to the input signal.

The anti-reflection layer RPL may be disposed on the input sensing part ISP. The refection prevention layer RPL may reduce reflectivity of external light which may be incident toward the display panel DP from above the display device DD. For example, the anti-reflection layer RPL may include a polarization film capable of reducing the reflectivity of the external light, and the polarization film may include a phase retarder and/or a polarizer. The anti-reflection layer RPL may be defined as a polarization layer.

The second adhesive layer AL2 may be disposed between the anti-reflection layer RPL and the input sensing part ISP. The anti-reflection layer RPL and the input sensing part ISP may be bonded to each other by the second adhesive layer AL2.

The window WIN may be disposed on the anti-reflection layer RPL. The window WIN may include a plastic material, glass, or a combination thereof. The window WIN may protect the display panel DP, the input sensing part ISP, and the anti-reflection layer RPL, against scratches and impact from the outside. The window WIN may be disposed above the first area AA1 and the bending area BA.

The third adhesive layer AL3 may be disposed between the window WIN and the anti-reflection layer RPL. The window WIN and the anti-reflection layer RPL may be bonded to each other by the third adhesive layer AL3.

The first to third adhesive layers AL1 to AL3 may include a pressure sensitive adhesive (PSA) layer or a transparent adhesive layer such as an optically clear adhesive (OCA) layer.

The anti-reflection layer RPL may be disposed in the first area AA1, the bending area BA, and the second area AA2. The anti-reflection layer RPL may be disposed, in the first area AA1, between the input sensing part ISP and the window WIN and extend into the bending area BA and the second area AA2. The anti-reflection layer RPL may extend into a portion of the second area AA2 adjacent to the bending area BA.

The second adhesive layer AL2 may be disposed, in the first area AA1, between the input sensing part ISP and the anti-reflection layer RPL and extend into the bending area BA and the second area AA2. The second adhesive layer AL2 may be disposed between the anti-reflection layer RPL and the substrate SUB in the bending area BA and between the anti-reflection layer RPL and the substrate SUB in the second area AA2. The anti-reflection layer RPL may be attached to the substrate SUB in the bending area BA and the second area AA2 by the second adhesive layer AL2.

Although not illustrated, lines may be disposed on the substrate SUB in the bending area BA. The lines may include, as described above, the data lines DL1 to DLn, the first and second control lines CSL1 and CSL2, and the first and second power lines PL1 and PL2. The lines may extend from the pixel layer PXL to the second area AA2 via the bending area BA.

The anti-reflection layer RPL may be disposed on the lines in the bending area BA and the second area AA2 and protect the lines. The anti-reflection layer RPL may complement the rigidity of the bending area BA and prevent cracking in the bending area BA in case that the substrate in the bending area BA is bent. The anti-reflection layer RPL may protect the bending area BA against an external impact.

The data driver DDV may be disposed in the second area AA2. The data driver DDV may be disposed spaced apart from the anti-reflection layer RPL. The printed circuit board PCB may be disposed on one side of the second area AA2. The timing controller T-CON may be disposed on the printed circuit board PCB. The data driver DDV may be disposed, in the second area AA2, between the printed circuit board PCB and the anti-reflection layer RPL.

The cover tape CTP may be disposed in the second area AA2 to cover the data driver DDV. The cover tape CTP may be disposed on a portion of the printed circuit board PCB disposed in the second area AA2. The cover tape CTP may be disposed on a portion of the anti-reflection layer RPL disposed in the second area AA2. The cover tape CTP may include an insulating tape including an organic material.

The first alignment marks AMK1 may be defined in the first area AA1. The second alignment marks AMK2 may be defined in the anti-reflection layer RPL. The second alignment marks AMK2 may be defined in the portion of the anti-reflection layer RPL disposed in the second area AA2. Thus, in case viewed in a plan view, the second alignment marks AMK2 may overlap the second area AA2.

The first alignment marks AMK1 and the second alignment marks AMK2 may be adjacent to the bending area BA. The bending area BA may be disposed between the first alignment marks AMK1 and the second alignment marks AMK2.

The first alignment marks AMK1 and the conductive pattern of the transistor TR illustrated in FIG. 3 may be disposed on a same layer. The conductive pattern may include a metal pattern for forming the gate G and a semiconductor pattern for forming the source S and the drain D. However, embodiments of the inventive concept are not limited thereto, and the first alignment marks AMK1 and a metal layer that forms the connection electrode CNE may be disposed on a same layer. The first alignment marks AMK1 and the conductive pattern may be simultaneously formed using a same material through patterning.

Referring to FIGS. 4 and 5, the second alignment marks AMK2 may be defined on the top surface of the anti-reflection layer RPL. For example, portions of the top surface of the anti-reflection layer RPL may be recessed downward to a depth, and thus, the second alignment marks AMK2 may be formed. For example, the second alignment marks AMK2 may be engraved. However, this is described as an example, and the second alignment marks AMK2 may be embossed on the anti-reflection layer RPL, or otherwise defined.

Referring to FIG. 6, the anti-reflection layer RPL may include a polarization film PFM for reducing the reflectivity of external light and a hard coating layer HC disposed on the polarization film PFM. The hard coating layer HC may define the top surface of the anti-reflection layer RPL. The polarization film PFM may include a phase retarder and/or a polarizer to reduce the reflectivity of the external light. The hard coating layer HC may have a role in protecting the polarization film PFM against scratch and impact from the outside.

The second alignment marks AMK2 may be defined in the hard coating layer HC. The second alignment marks AMK2 may be defined by removing portions of the hard coating layer HC.

Functions of the first and second alignment marks AMK1 and AMK2 will be described below in detail.

Figure 7:
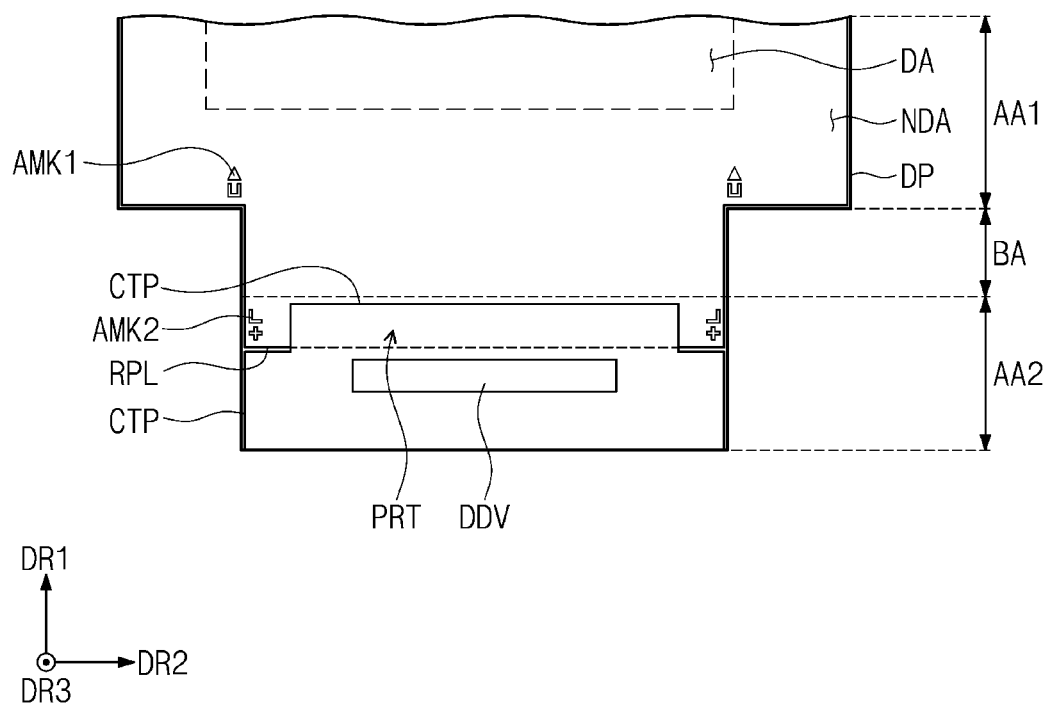
FIG. 7 is a schematic view illustrating, in a plan view, first alignment marks defined in a display panel of FIG. 4 and second alignment marks defined in an anti-reflection layer of FIG. 4.

FIG. 7 is a schematic view illustrating, in a plan view, the first alignment marks defined in the display panel of FIG. 4 and the second alignment marks defined in the anti-reflection layer of FIG. 4.

Referring to FIG. 7, the first alignment marks AMK1 may have a shape different from that of the second alignment marks AMK2. The first alignment marks AMK1 may have a triangular shape and a groove shape, but the shape of the first alignment marks AMK1 is not limited thereto. The second alignment marks AMK2 may have an "L" shape and a cross shape, but the shape of the second alignment marks AMK2 is not limited thereto.

In case viewed in a plan view, the cover tape CTP may not overlap the second alignment marks AMK2. The cover tape CTP may protrude toward the bending area BA. A protrusion portion PRT of the cover tape CTP, protruding toward the bending area BA, may be disposed between the second alignment marks AMK2 and may not overlap the second alignment marks AMK2.

The first alignment marks AMK1 and the second alignment marks AMK2 may be disposed with the bending area BA therebetween and may be adjacent to the bending area BA. The first alignment marks AMK1 may be disposed adjacent to both sides of the first area AA1 which may be opposite to each other in the second direction DR2, but the arrangement positions of the first alignment mark AMK1 are not limited thereto. The second alignment marks AMK2 may be disposed adjacent to both sides of the second area AA2 which may be opposite to each other in the second direction DR2, but the arrangement positions of the second alignment mark AMK2 are not limited thereto.

Figure 8:
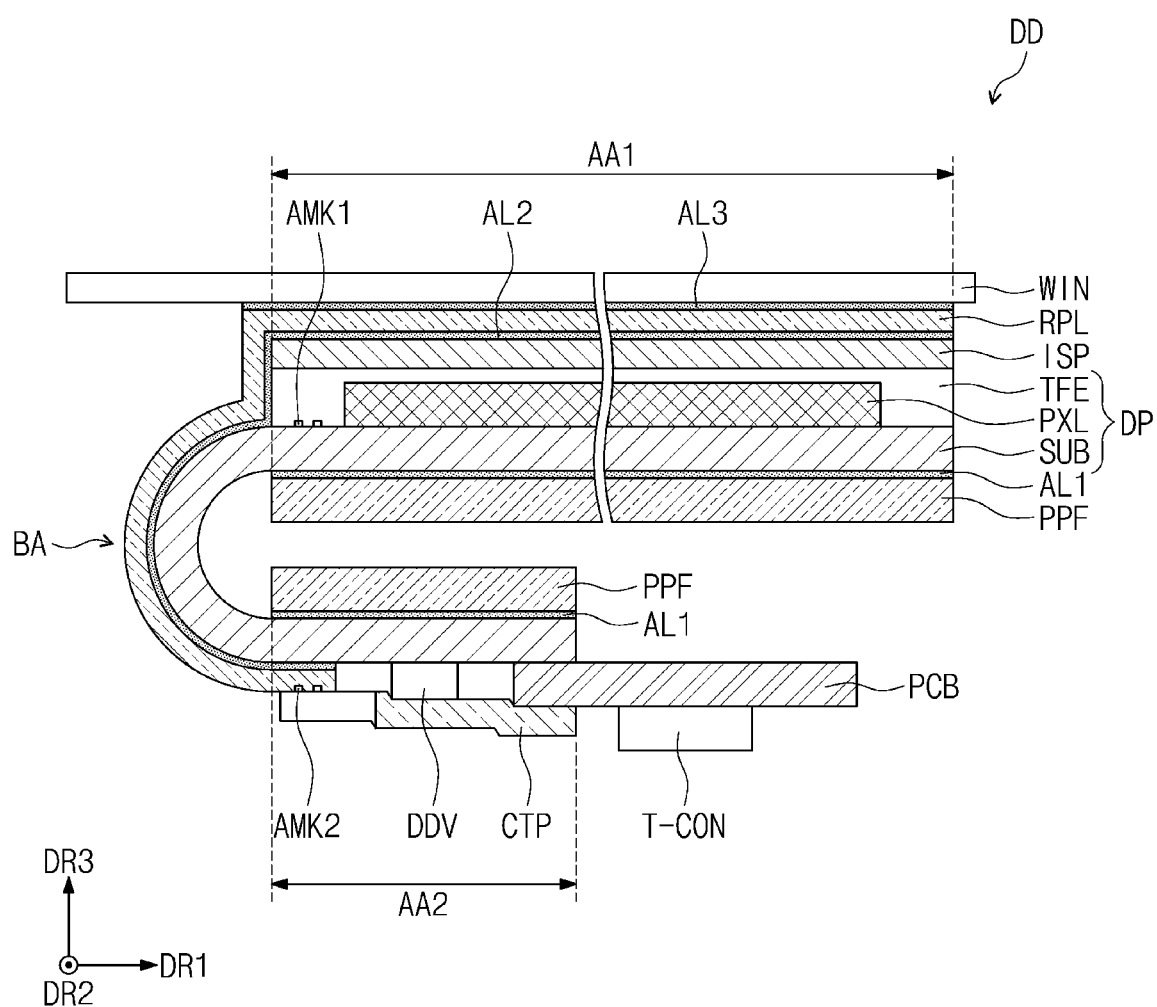
FIG. 8 is a schematic view illustrating a bending state of a bending area illustrated in FIG. 4.
Figure 9:
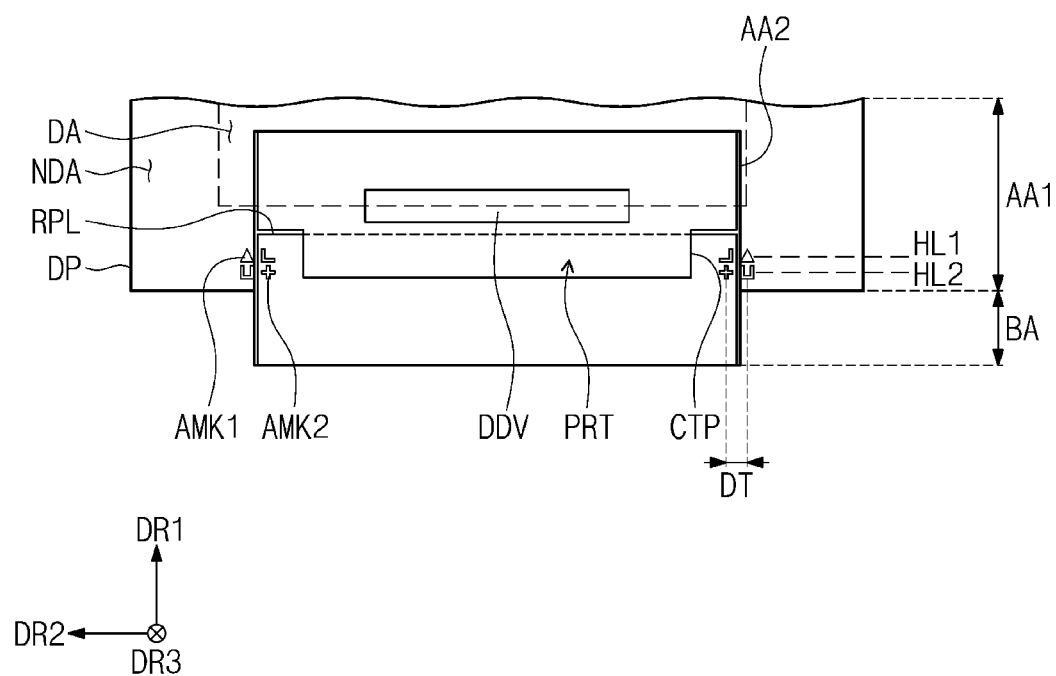
FIG. 9 is a schematic view in case a bending area and a second area illustrated in FIG. 8 are viewed in a plan view.

FIG. 8 is a schematic view illustrating a bending state of the bending area illustrated in FIG. 4. FIG. 9 is a schematic view in case the bending area and the second area illustrated in FIG. 8 are viewed in a plan view.

For example, FIG. 9 illustrates a state in which the display device DD is viewed from bottom to top. For example, FIG. 9 illustrates a state in which the rear surface of the display panel DP, on which the second area AA2 may be disposed, is viewed. The printed circuit board PCB and the timing controller T-CON are omitted in FIG. 9.

Referring to FIG. 8, the bending area BA may be bent so that the second area AA2 may be disposed below the first area AA1. Thus, the data driver DDV may be disposed below the first area AA1.

The bending area BA may be bent to protrude toward the outside of the display panel DP. The bending area BA may be bent with curvature. The data driver DDV may be disposed below the second area AA2 in FIG. 8.

Referring to FIG. 8 and FIG. 9, the second area AA2 may be disposed below the first area AA1, and in case viewed in a plan view, the second alignment mark AMK2 may be adjacent to the first alignment marks AMK1. The first alignment marks AMK1 and the second alignment marks AMK2 may be arranged in the second direction DR2. In case viewed in a plan view, the first alignment marks AMK1 may be adjacent to both sides of the second area AA2 which may be opposite to each other in the second direction DR2.

The first alignment marks AMK1 and the second alignment marks AMK2 may be arranged so that the bending area BA has curvature. For example, in case that the bending area BA is bent and viewed in a plan view, the first alignment marks AMK1 and the second alignment marks AMK2 may be aligned with horizontal lines HL1 and HL2 parallel to each other in the second direction DR2. In case viewed in the second direction DR2, the first alignment marks AMK1 and the second alignment marks AMK2 may overlap each other with respect to the horizontal lines HL1 and HL2.

In case viewed in a plan view, the second alignment marks AMK2 may be aligned to be spaced a distance DT from the first alignment marks AMK1 in the second direction DR2. Both sides of the second area AA2 extending in the first direction DR1 may be disposed in parallel to the first direction DR1 without being misaligned with respect to the first direction DR1. In case that the first alignment marks AMK1 and the second alignment marks AMK2 may be aligned as described above, the bending area BA may be bent with desired curvature.

In case that the first alignment marks AMK1 and the second alignment marks AMK2 are not aligned with the horizontal lines HL1 and HL2, the second alignment marks AMK2 may be disposed further to the right than the position illustrated in FIG. 8. The bending area BA may be bent more, and thus, the bending area BA may not be bent with the desired curvature.

In case that the first alignment marks AMK1 and the second alignment marks AMK2 are not aligned with the horizontal lines HL1 and HL2, the second alignment marks AMK2 may be disposed further to the left than the position illustrated in FIG. 8. The bending area BA may be bent less, and thus, the bending area BA may not be bent with the desired curvature.

In case that the second alignment marks AMK2 are not aligned to be spaced the distance DT from the first alignment marks AMK1 in the second direction DR2, both sides of the second area AA2 extending in the first direction DR1 may be disposed to be misaligned with respect to the first direction DR1. Thus, the bending area BA may not be bent with the desired curvature.

In an embodiment of the inventive concept, in case that the bending area BA is bent, the first alignment marks AMK1 defined in the display panel DP and the second alignment marks AMK2 defined in the anti-reflection layer RPL may be aligned with each other, and thus, the bending area BA may be bent with the desired curvature.

FIGS. 10 to 15 are schematic views describing a method for manufacturing a display device according to an embodiment of the inventive concept.

Figure 10:
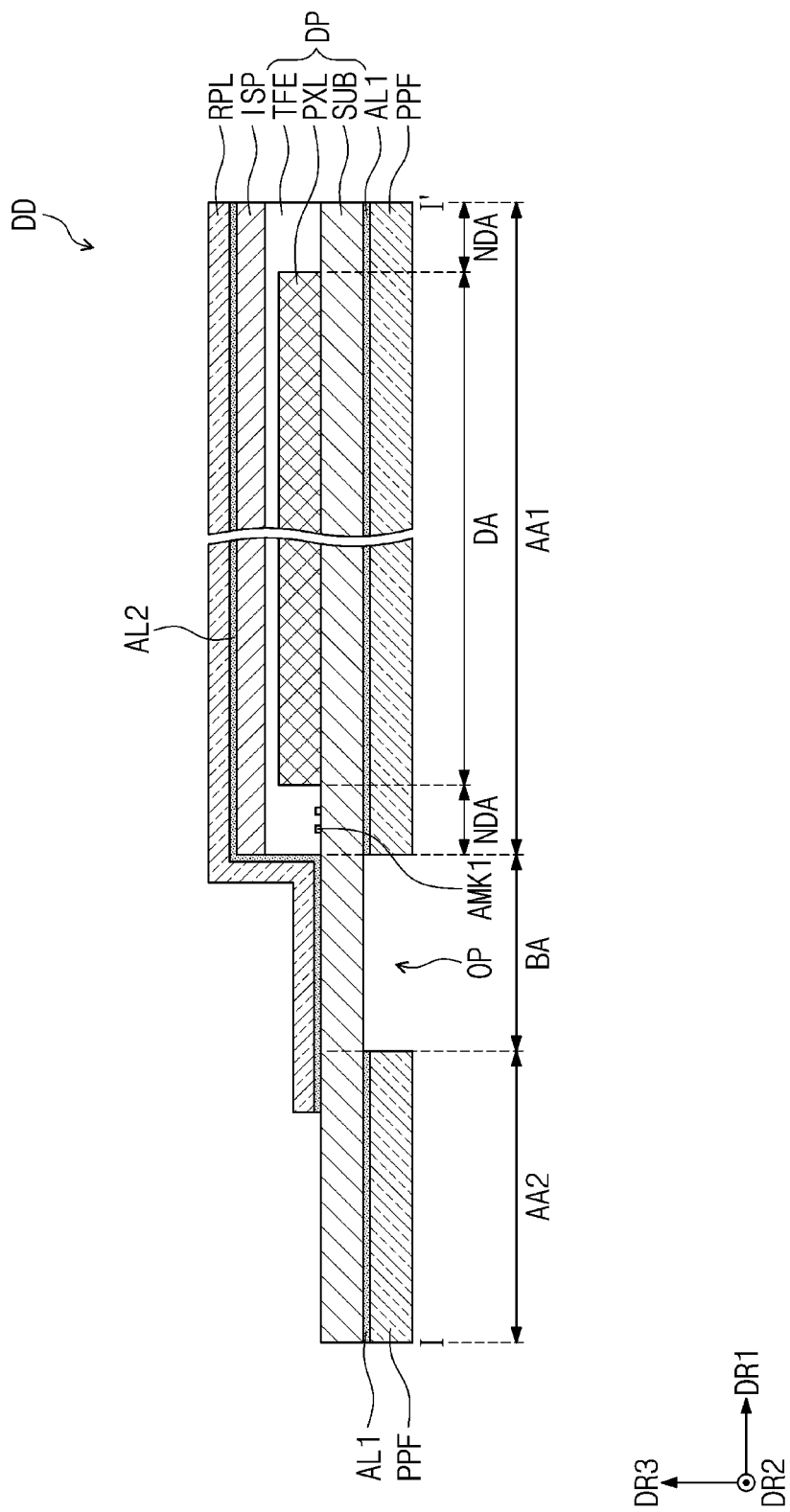
FIGS. 10 to 15 are schematic views describing a method for manufacturing a display device according to an embodiment of the inventive concept.

Referring to FIG. 10, a display panel DP, in which first alignment marks AMK1 are defined, may be prepared. An anti-reflection layer RPL may be provided on the display panel DP, and the anti-reflection layer RPL may be disposed in a first area AA1 and extend into a bending area BA and a second area AA2. A panel protective film PPF having an opening portion OP defined therein may be provided below the display panel DP.

Figure 11:
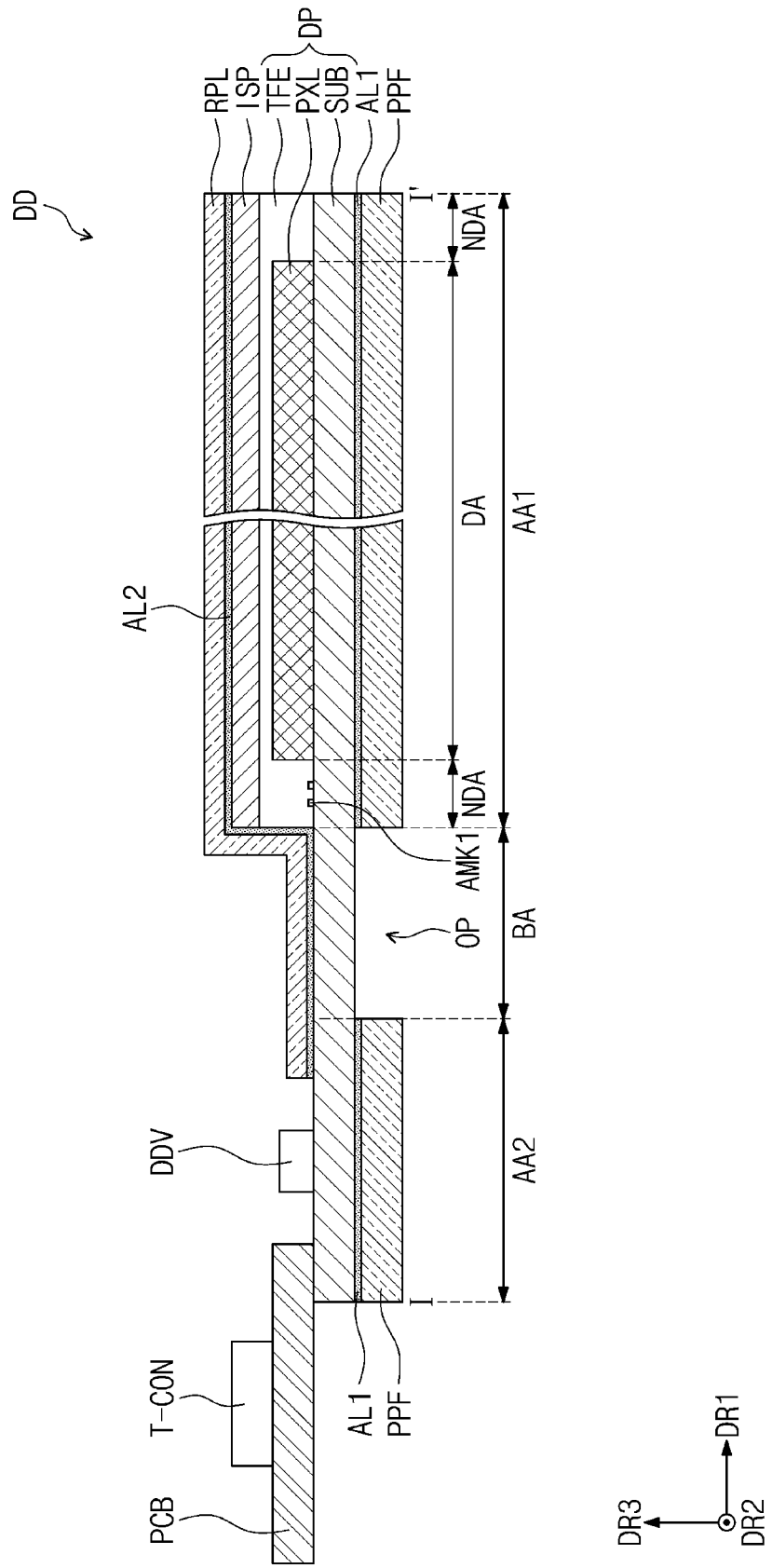

Referring to FIG. 11, a data driver DDV may be provided in the second area AA2. Also, a printed circuit board PCB to which a timing controller T-CON may be mounted may be provided in the second area AA2.

Figure 12:
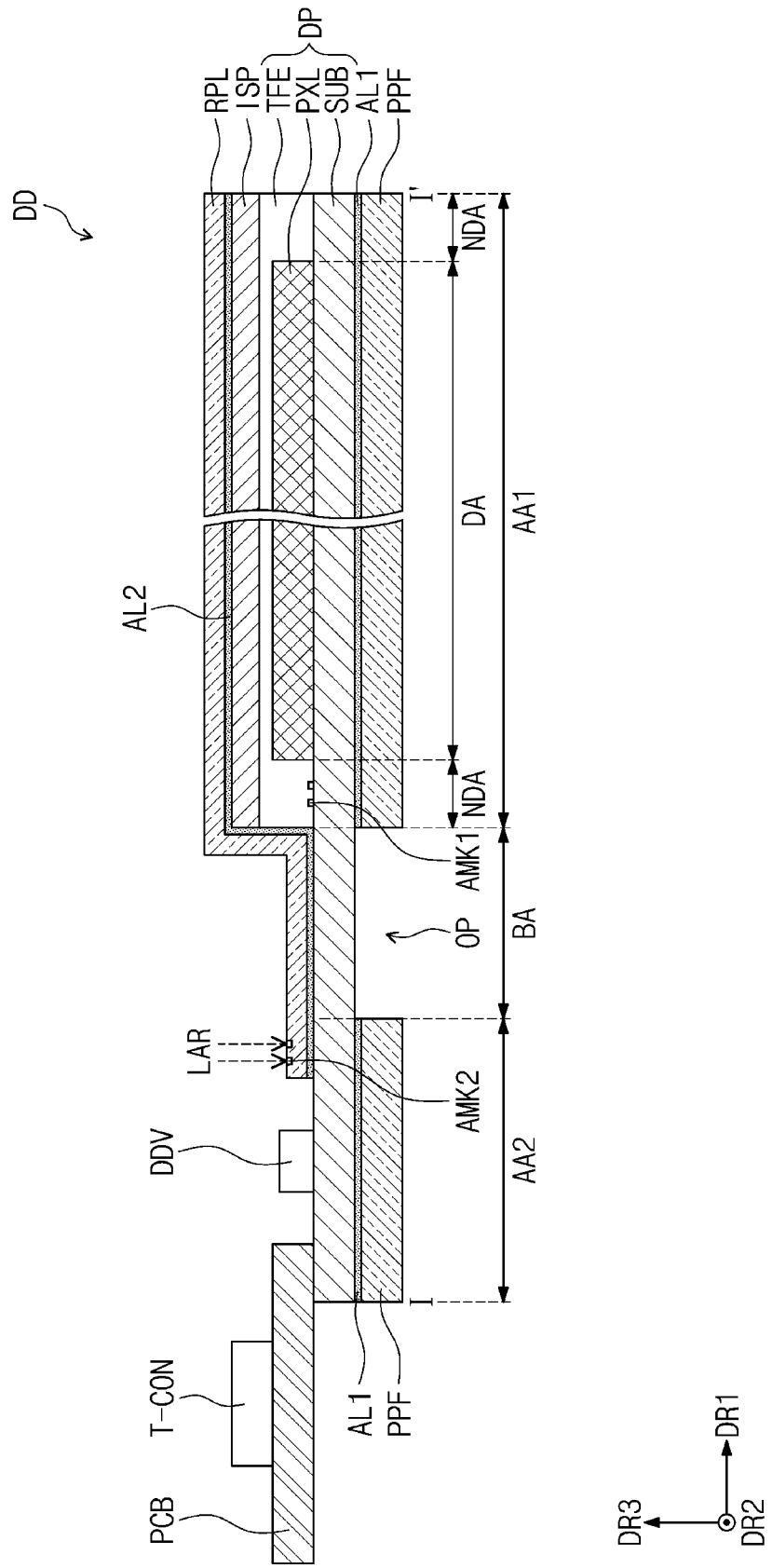
Figure 13:
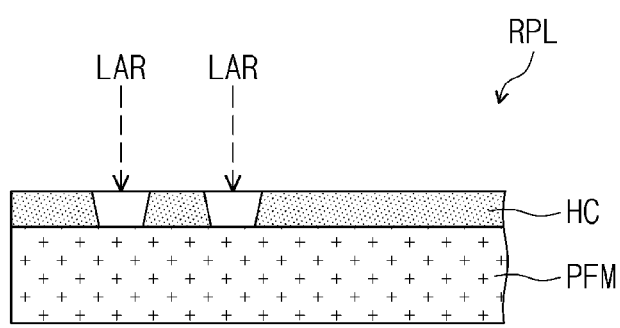

Referring to FIGS. 12 and 13, laser beams LAR may be emitted onto portions of the anti-reflection layer RPL overlapping the second area AA2 in case viewed in a plan view. The laser beams LAR may be emitted from above the anti-reflection layer RPL toward the top surface of the anti-reflection layer RPL.

By the laser beams LAR, second alignment marks AMK2 may be defined in the anti-reflection layer RPL. For example, portions of a hard coating layer HC may be removed by the laser beams LAR, and thus, the second alignment marks AMK2 may be defined in the hard coating layer HC. Thus, the second alignment marks AMK2 may be defined on the top surface of the anti-reflection layer RPL.

Figure 14:
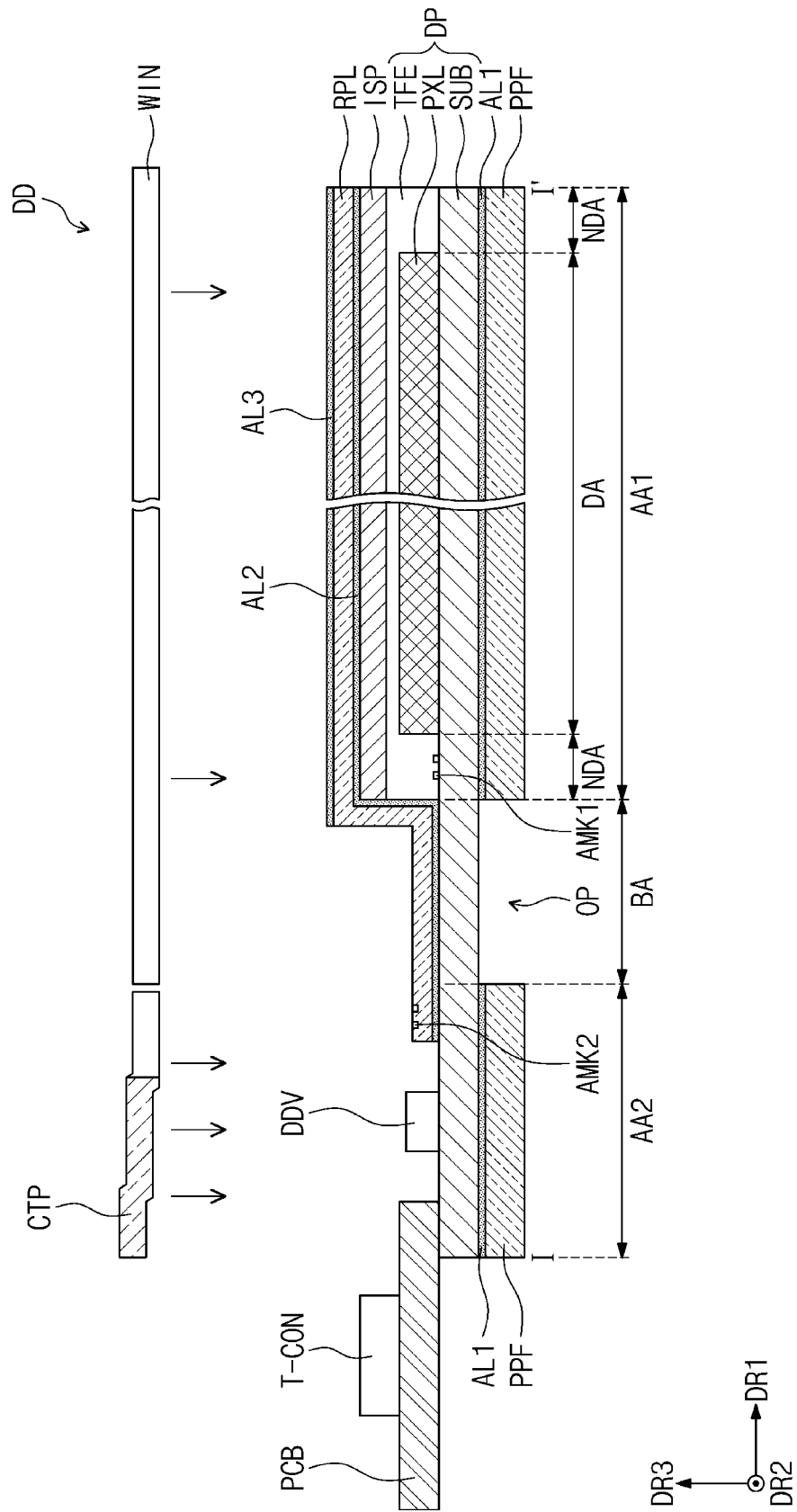

Referring to FIG. 14, a window WIN may be provided on the anti-reflection layer RPL, and a cover tape CTP may be provided in the second area AA2. The window WIN may be attached to the anti-reflection layer RPL by a third adhesive AL3. In the second area AA2, the cover tape CTP may be disposed on the data driver DDV and the anti-reflection layer RPL.

Figure 15:
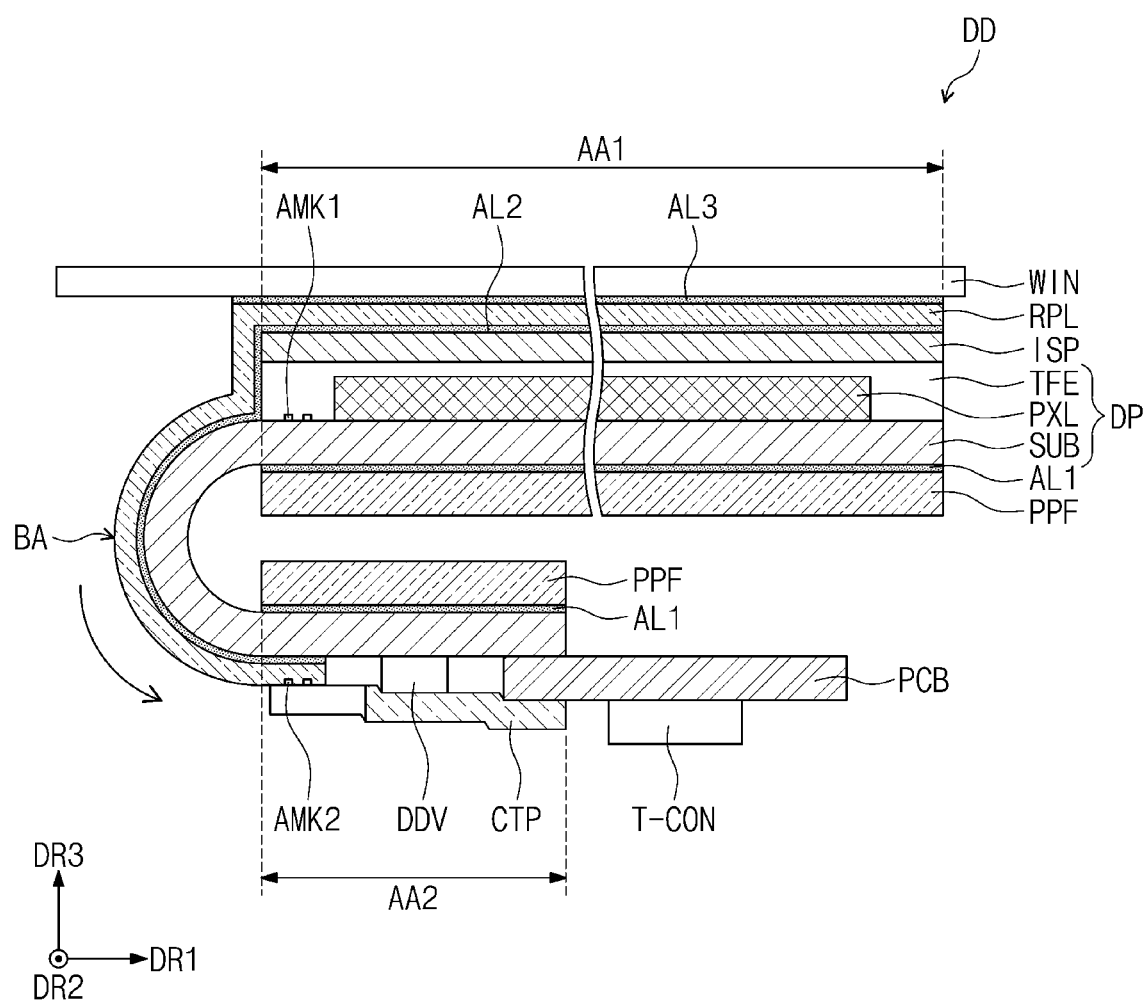

Referring to FIG. 15, the bending area BA may be bent so that the second area AA2 may be disposed below the first area AA1. In case that the bending area BA is bent, the second alignment marks AMK2 may be aligned with the first alignment marks AMK1. The method for aligning the first alignment marks AMK1 and the second alignment marks AMK2 may be the same as described above.

In a bending process of the bending area BA, the second alignment marks AMK2 and the first alignment marks AMK1 may be aligned with each other by viewing the display device DD from bottom to top. The second alignment marks AMK2 may not be defined in the anti-reflection layer RPL, but defined in the second area AA2 of the display panel DP disposed on the anti-reflection layer RPL. In case the display device DD is viewed from bottom to top, the second alignment marks defined in the second area AA2 of the display panel DP may be covered by the anti-reflection layer RPL and thus may not be viewed from the outside.

Referring to FIGS. 9 and 15, the second alignment marks AMK2 may be defined in the anti-reflection layer RPL in an embodiment of the inventive concept. Thus, in case the display device DD is viewed from bottom to top, the second alignment marks AMK2 may be easily viewed from the outside.

In case the display device DD is viewed from bottom to top, the first alignment marks AMK1 may not be covered by the anti-reflection layer RPL as illustrated in FIG. 9, and thus may be easily viewed. Thus, in the bending process of the bending area BA, the second alignment marks AMK2 may be easily aligned with the first alignment marks AMK1.

Figure 16:
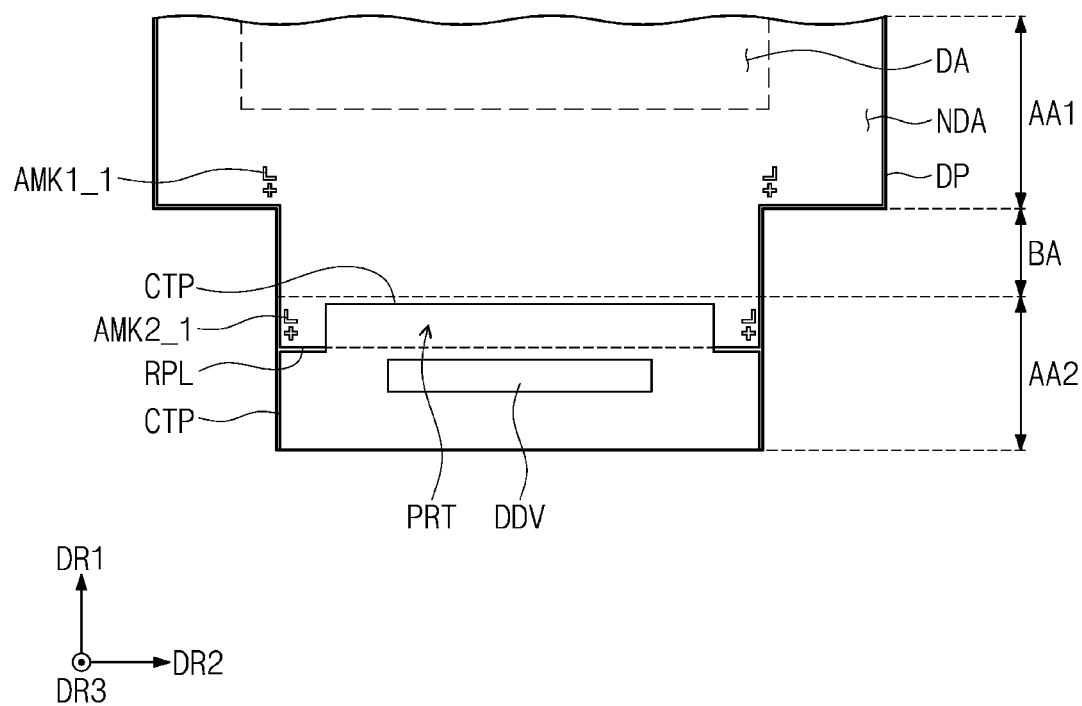
FIG. 16 is a schematic view illustrating first and second alignment marks according to another embodiment of the inventive concept.

FIG. 16 is a schematic view illustrating first and second alignment marks according to another embodiment of the inventive concept.

FIG. 16 illustratively shows a plan view corresponding to FIG. 7.

Referring to FIG. 16, first alignment marks AMK1_1 and second alignment marks AMK2_1 may have a same shape, unlike the first and second alignment marks AMK1 and AMK2 illustrated in FIG. 7. For example, the first alignment marks AMK1_1, which may be disposed adjacent to both sides of a first area AA1 opposite to each other in a second direction DR2, may have shapes symmetrical to each other. Also, the second alignment marks AMK2_1, which may be disposed adjacent to both sides of a second area AA2 opposite to each other in the second direction DR2, may have shapes symmetrical to each other.

According to an embodiment of the inventive concept, the first alignment mark may be defined in the display panel, and the second alignment mark may be defined in the anti-reflection layer disposed on the display panel. In case that the bending area of the display panel is bent, the second alignment mark may be aligned with the first alignment mark. Accordingly, the bending area may be bent with the predetermine curvature.

Although embodiments of the invention have been described, it is understood that various changes and modifications can be made by one ordinarily skilled in the art within the spirit and scope of the invention as presented hereinafter in the claims, including any equivalents. Also, the embodiments disclosed in the invention are not intended to limit the technical ideas of the invention, and all technical ideas within the following claims and their equivalents should be interpreted to be included in the scope of the invention.

What is claimed is:

1. A display device comprising:
a display panel; and
an anti-reflection layer disposed on the display panel, wherein
the display panel comprises:
a first area including a first alignment mark;
a bending area extending from the first area; and
a second area extending from the bending area in a direction opposite the first area, wherein
the anti-reflection layer includes a second alignment mark overlapping the second area in a plan view,
the first alignment mark and the second alignment mark are disposed on different layers,
when viewed in a plan, the bending area is disposed between the first alignment mark and the second alignment mark,
the bending area is bent,
in case that the bending area is bent, the second area is disposed below the first area, and
in case the display device is viewed from bottom to top, the second alignment marks and the first alignment marks are aligned with each other.

2. The display device of claim 1, wherein the second alignment mark is defined on a surface of the anti-reflection layer.

3. The display device of claim 1, wherein the anti-reflection layer comprises:
a polarization film; and
a hard coating layer disposed on the polarization film, wherein the second alignment mark is defined on the hard coating layer.

4. The display device of claim 1, wherein the first alignment mark and the second alignment mark are adjacent to the bending area.

5. The display device of claim 1, wherein the first alignment mark has a shape different from a shape of the second alignment mark.

6. The display device of claim 1, wherein the first area comprises:
a display area comprising a pixel; and
a non-display area adjacent to the display area,
wherein the first alignment mark is defined in the non-display area.

7. The display device of claim 6, wherein the pixel comprises:
a transistor; and
a light emitting element electrically connected to the transistor, wherein
the first alignment mark and a conductive pattern of the transistor are disposed on a same layer.

8. The display device of claim 7, wherein the first alignment mark and the conductive pattern include a same material and are simultaneously formed by patterning.

9. The display device of claim 1, further comprising:
a driver spaced apart from the anti-reflection layer and disposed in the second area; and
a cover tape disposed in the second area to cover the driver, wherein
the cover tape is disposed on the anti-reflection layer disposed in the second area, and
the cover tape does not overlap the second alignment mark.

10. The display device of claim 1, wherein
the first area, the bending area, and the second area are arranged in a first direction, and
the bending area extends in a second direction crossing the first direction.

11. The display device of claim 10, wherein
the first alignment mark is provided in plurality, and
the plurality of first alignment marks are disposed adjacent to sides of the first area which are opposite to each other in the second direction.

12. The display device of claim 10, wherein
the second alignment mark is provided in plurality, and
the plurality of second alignment marks are disposed adjacent to sides of the second area which are opposite to each other in the second direction.

13. The display device of claim 10, wherein
the first alignment mark and the second alignment mark are aligned with a horizontal line parallel to the second direction in case that the bending area is bent, and
the second alignment mark is spaced from the first alignment mark in the second direction in case that the bending area is bent.

14. The display device of claim 1, further comprising:
a panel protective film disposed below the display panel and in which an opening portion overlapping the bending area is defined;
an input sensing part disposed in the first area; and a window disposed on the input sensing part, wherein
the anti-reflection layer is disposed in the first area and between the input sensing part and the window, the anti-reflection layer extending into the bending area and the second area.

15. The display device of claim 1, wherein the first alignment mark and the second alignment mark have a same shape.

16. The display device of claim 1, wherein
the first area and the second area are both disposed on a common substrate, and
the first alignment mark is disposed directly on the substrate.

17. The display device of claim 16, wherein the second alignment mark is spaced apart from the substrate.

* * * * *